(12) United States Patent
Ozawa et al.

(10) Patent No.: US 7,060,559 B2
(45) Date of Patent: Jun. 13, 2006

(54) METHOD OF MANUFACTURING A NONVOLATILE SEMICONDUCTOR MEMORY DEVICE

(75) Inventors: Yoshio Ozawa, Yokohama (JP);
Katsuhiko Hieda, Yokohama (JP);
Atsuko Kawasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/352,083

(22) Filed: Jan. 28, 2003

(65) Prior Publication Data
US 2004/0104421 A1 Jun. 3, 2004

(30) Foreign Application Priority Data
Nov. 29, 2002 (JP) ............... 2002-347792

(51) Int. Cl.
*H01L 21/336* (2006.01)
*H01L 21/76* (2006.01)
(52) U.S. Cl. ...................... 438/257; 438/424
(58) Field of Classification Search ........ 438/257–267, 438/142, 197, 424–428; 257/314–320, E29.129, 257/E29.3, E21.179, E21.422, E21.68, E21.681, 257/E21.683, E21.686, E21.687, E21.688
See application file for complete search history.

(56) References Cited

U.S. PATENT DOCUMENTS

| 5,866,930 A | 2/1999 | Saida et al. | |
|---|---|---|---|
| 6,191,002 B1 * | 2/2001 | Koyanagi | 438/431 |
| 6,228,717 B1 * | 5/2001 | Hazama et al. | 438/265 |
| 6,235,589 B1 * | 5/2001 | Meguro | 438/267 |
| 6,239,041 B1 * | 5/2001 | Tanabe et al. | 438/773 |

(Continued)

FOREIGN PATENT DOCUMENTS

JP 09-008156 1/1997

(Continued)

OTHER PUBLICATIONS

Yoshio Ozawa et al., U.S. Appl. No.: 09/559,757, Filed Apr. 27, 2000, For:Semiconductor Device and Method of Manufacture Thereof.

(Continued)

*Primary Examiner*—Brook Kebede
(74) *Attorney, Agent, or Firm*—Finnegan, Henderson, Farabow, Garrett & Dunner L.L.P.

(57) ABSTRACT

In a method of manufacturing a semiconductor device having a nonvolatile semiconductor memory element with a two-layered gate structure in which a floating gate and control gate are stacked, a polysilicon layer serving as the floating gate is stacked on a silicon substrate via a tunnel insulating film. Then, the silicon layer, tunnel insulating film, and substrate are selectively etched to form an element isolation trench. A nitride film is formed on the sidewall surface of the silicon layer exposed into the element isolation trench. An oxide film is buried in the element isolation trench. A conductive film serving as the control gate is stacked on the oxide film and silicon layer via an electrode insulating film. The conductive film, electrode insulating film, and silicon layer are selectively etched to form the control gate and floating gate.

14 Claims, 10 Drawing Sheets

U.S. PATENT DOCUMENTS

| | | | |
|---|---|---|---|
| 6,342,715 B1 * | 1/2002 | Shimizu et al. | 257/314 |
| 6,580,117 B1 * | 6/2003 | Shimizu | 257/315 |
| 6,677,639 B1 * | 1/2004 | Lee et al. | 257/314 |
| 2002/0100930 A1 * | 8/2002 | Yaegashi | 257/315 |
| 2003/0119257 A1 * | 6/2003 | Dong et al. | 438/257 |

FOREIGN PATENT DOCUMENTS

| | | |
|---|---|---|
| JP | 9-64209 | 3/1997 |
| JP | 2000-188343 | 7/2000 |
| JP | 2001-015618 | 1/2001 |
| JP | 2001-15753 | 1/2001 |
| JP | 2001-015753 | 1/2001 |
| JP | 3178412 | 4/2001 |
| JP | 2001-319927 | 11/2001 |
| JP | 2003-197788 | 7/2003 |

OTHER PUBLICATIONS

Notification of Reasons for Rejection issued by Japanese Patent Office in Japanese application No. 2002-347792 and English translation thereof.

Final Notice of Rejection issued by Japanese Patent Office in Japanese application No. 2002-347792 and English translation thereof.

* cited by examiner

METHOD OF MANUFACTURING A NONVOLATILE SEMICONDUCTOR MEMORY DEVICE

CROSS-REFERENCE TO RELATED APPLICATIONS

This application is based upon and claims the benefit of priority from the prior Japanese Patent Application No. 2002-347792, filed Nov. 29, 2002, the entire contents of which are incorporated herein by reference.

BACKGROUND OF THE INVENTION

1. Field of the Invention

The present invention relates to a semiconductor device having a nonvolatile semiconductor memory element and a method of manufacturing the same and, more particularly, to a semiconductor device which improves the floating gate electrode structure of a nonvolatile semiconductor memory element and a method of manufacturing the same.

2. Description of the Related Art

A nonvolatile semiconductor memory element having a two-layered gate structure is formed by stacking a floating gate electrode and control gate electrode on a semiconductor substrate. Of the two gate electrodes, the floating gate electrode is used as a charge storage layer. The floating gate electrode is generally made of polysilicon.

However, the nonvolatile semiconductor memory element of this type has the following problem. The shape of finished polysilicon crystal grain of a floating gate electrode changes between memory elements even when they are arrayed on a single chip. When the shape of finished polysilicon crystal grain changes between memory elements, the memory characteristic such as the threshold value after write/erase operation varies between elements.

This problem will be described in detail. In manufacturing a nonvolatile semiconductor memory element having a two-layered gate structure, polysilicon for a prospective charge storage layer is deposited by CVD and then processed into an electrode pattern by RIE. At this time, the polysilicon pattern is rectangular. However, the silicon crystal grain grows in a high-temperature process such as thermal oxidation for forming an electrode sidewall oxide film. For this reason, the floating gate electrode has a final finished shape different from the rectangular shape immediately after the process. In addition, the finished shape changes between elements.

When the final finished shape of the floating gate electrode varies between elements, the electric capacitance between the floating gate electrode and the silicon substrate or that between the floating gate electrode and the control gate electrode varies between the elements. For this reason, the memory characteristic such as the threshold value after write/erase operation varies between the elements. The necessity of an excess operation time margin impedes high-speed operation. Additionally, the wide threshold value distribution hinders realizing a multilevel memory. If the variation in shape is large, the memory device causes operation errors.

Even when the silicon layer serving as the floating gate electrode is formed not in a polycrystalline state but in an amorphous state, the above problem is hard to solve. This is because the silicon layer always changes to a polycrystal in the subsequent high-temperature process.

As a prior art related to the present invention, a semiconductor device using a floating gate electrode including a layer doped with nitrogen has been proposed (Jpn. Pat. Appln. KOKAI Publication No. 9-64209). Also, a method of forming a silicon oxide film on the sidewall of a floating gate electrode by using radical oxygen has been proposed (Jpn. Pat. Appln. KOKAI Publication No. 2001-15753). A trench isolation technique using silazane polymer has also been proposed (Japanese Patent No. 3178412) (Jpn. Pat. Appln. KOKAI Publication No. 2001-319927). However, in any of the above prior arts, it is difficult to eliminate the variation in finished shape of the floating gate electrode formed from polysilicon.

BRIEF SUMMARY OF THE INVENTION

According to an aspect of the present invention, there is provided a semiconductor device having a nonvolatile semiconductor memory element with a two-layered gate structure, comprising: a floating gate electrode which is made of polysilicon and formed on a semiconductor substrate via a tunnel insulating film; a control gate electrode which is formed on the floating gate electrode via an electrode insulating film; and a nitride film which is formed on at least part of a sidewall surface of the floating gate electrode.

According to another aspect of the present invention, there is provided a semiconductor device having a nonvolatile semiconductor memory element with a two-layered gate structure, comprising: an element isolation region which is formed on one major surface side of a semiconductor substrate to surround an element formation region in which the nonvolatile semiconductor memory element is to be formed; a floating gate electrode which is made of polysilicon and formed in part of the element formation region via a tunnel insulating film and has two sidewalls along a direction of channel length and two sidewalls along a direction of channel width; a control gate electrode which is formed on the floating gate electrode via an electrode insulating film; a nitride film which is formed at least on the two sidewalls along the direction of channel length of the four sidewalls of the floating gate electrode; and an element isolation insulating film which is buried in the element isolation region.

According to still another aspect of the present invention, there is provided a method of manufacturing a semiconductor device having a nonvolatile semi-conductor memory element with a two-layered gate structure, comprising: forming a floating gate electrode made of one of polysilicon and amorphous silicon on one major surface of a semiconductor substrate; and forming a nitride film on at least part of a sidewall surface of the floating gate electrode.

According to still another aspect of the present invention, there is provided a method of manufacturing a semiconductor device having a nonvolatile semiconductor memory element with a two-layered gate structure, comprising: forming a floating gate electrode made of one of polysilicon and amorphous silicon in part of an element formation region on one major surface side of a semiconductor substrate via a tunnel insulating film; forming a nitride film at least on sidewalls along a direction of channel length of the two sidewalls along the direction of channel length and two sidewalls along a direction of channel width of the floating gate electrode; and forming a control gate electrode on the floating gate electrode via an electrode insulating film.

According to still another aspect of the present invention, there is provided a method of manufacturing a semiconductor device having a nonvolatile semi-conductor memory element with a two-layered gate structure, comprising: stacking a tunnel insulating film and one of a polysilicon layer and an amorphous silicon layer serving as a floating gate electrode on one major surface of a semiconductor substrate; selectively etching the silicon layer, the tunnel insulating film, and the semiconductor substrate using a mask having a pattern corresponding to an element isolation trench so as to form the element isolation trench; forming a nitride film on a sidewall surface of the silicon layer exposed into the element isolation trench and burying an element isolation insulating film in the element isolation trench; stacking an electrode insulating film and a conductive film serving as a control gate electrode on the element isolation insulating film and silicon layer; and selectively etching the conductive film, the electrode insulating film, and the silicon layer using a mask having a pattern corresponding to the control gate electrode so as to form the control gate electrode and floating gate electrode.

According to still another aspect of the present invention, there is provided a method of manufacturing a semiconductor device having a nonvolatile semiconductor memory element with a two-layered gate structure, comprising the steps of: forming a tunnel insulating film and one of a polysilicon layer and an amorphous silicon layer serving as a floating gate electrode on one major surface of a semiconductor substrate; selectively etching the silicon layer, the tunnel insulating film, and the semiconductor substrate using a mask having a pattern corresponding to an element isolation trench so as to form the element isolation trench; forming a nitride film on a sidewall surface of the silicon layer exposed into the element isolation trench and burying an element isolation insulating film in the element isolation trench; stacking an electrode insulating film and a conductive film serving as a control gate electrode on the element isolation insulating film and silicon layer; selectively etching the conductive film, the electrode insulating film, and the silicon layer using a mask having a pattern corresponding to the control gate electrode so as to form the control gate electrode and floating gate electrode; and forming a silicon oxide film, in an atmosphere containing radical oxygen, on the sidewall surface of the floating gate electrode newly formed in the gate process.

According to still another aspect of the present invention, there is provided a method of manufacturing a semiconductor device having a transistor element, comprising: forming an element isolation trench on one major surface side of a semiconductor substrate to surround an element formation region; burying a coating film containing nitrogen in the element isolation trench; converting the coating film into a first silicon oxide film to form an element isolation insulating film and nitriding substrate silicon on a sidewall surface of the element isolation trench; and forming a second silicon oxide film on a substrate surface in the element formation region in an atmosphere containing radical oxygen.

DETAILED DESCRIPTION OF THE INVENTION

Details of the present invention will be described below in accordance with illustrated embodiments.

First Embodiment

Figure 1A:
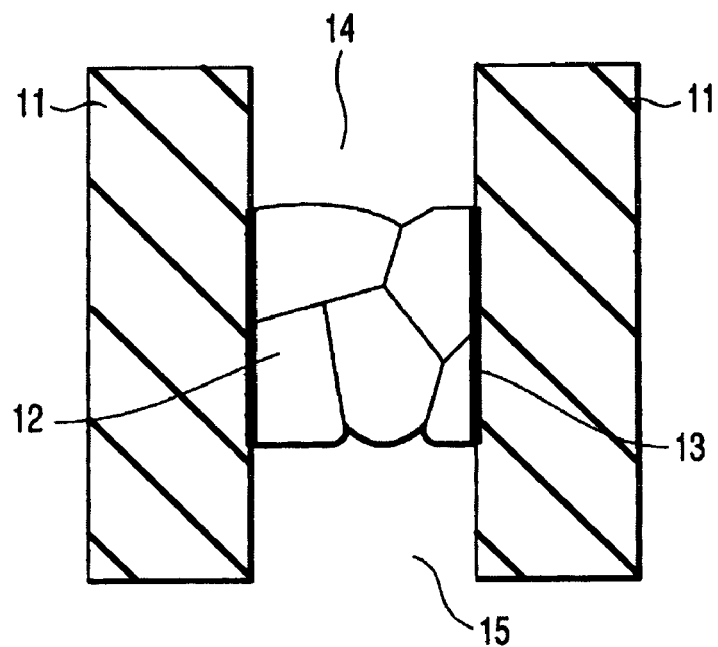
FIGS. 1A and 1B are schematic views showing comparison between an embodiment and a prior art so as to explain a sectional structure obtained by cutting a nonvolatile semiconductor memory element along a plane including a floating gate electrode.

FIG. 1A is a view showing the sectional structure of a memory element formed by the first embodiment, which is taken along a plane including the lower layer portion of a floating gate electrode. Referring to FIG. 1A, reference numeral 11 denotes an element isolation region; 12, a floating gate electrode; 14, a source region; and 15, a drain region.

In this embodiment, sidewall nitride layers 13 are formed on at least part of the floating gate electrode sidewall surfaces before the silicon crystal grain of the floating gate electrode 12 grows, as shown in FIG. 1A. With this process, growth of the silicon crystal grain is suppressed, and the variation in finished shape between elements is largely reduced.

Normally, it is necessary to form electrode sidewall oxide films on the sidewall surfaces on the source/drain diffusion layer sides. Hence, it is preferable to form sidewall nitride layers on the sidewall surfaces on the element isolation sides. The sidewall nitride layer can be formed from an arbitrary nitride that hardly deforms and passes an oxidant. Silicon nitride is most preferable because it is easy to form and has little bad influence on a tunnel insulating film.

Figure 1B:
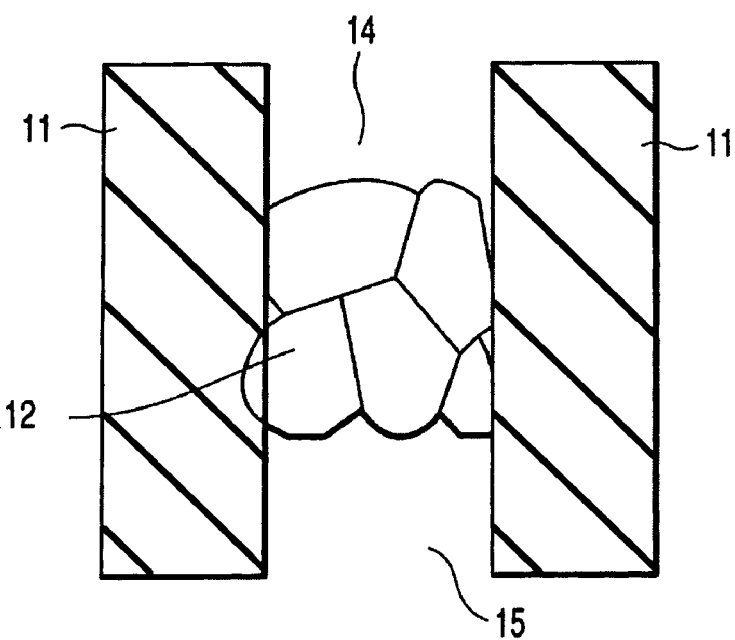

FIG. 1B shows a sectional structure of a memory element formed by a prior art for comparison, which is taken along a plane including the lower layer portion of a floating gate electrode. The silicon crystal grain grows in a high-temperature process such as thermal oxidation in forming an electrode sidewall oxide film. For this reason, the finished shape of the floating gate electrode 12 is different from the rectangular shape immediately after the process. Since the finished shape changes between elements, the memory characteristic such as the threshold value after write/erase operation varies between the elements.

A method of manufacturing the nonvolatile semiconductor memory element according to this embodiment will be described below with reference to FIGS. 2A to 2F and 3A to 3F. FIGS. 2A to 2F show a section taken along the direction of channel length, and FIGS. 3A to 3F show a section taken along the direction of channel width. FIGS. 2A to 2F correspond to FIGS. 3A to 3F, respectively. FIGS. 2A to 2F and 3A to 3F show only one memory element. In fact, a number of memory elements are simultaneously formed to constitute a semiconductor memory.

Figure 2A:
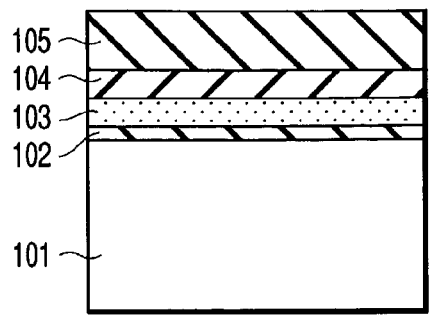
FIGS. 2A to 2F are sectional views taken along the direction of channel length and showing steps in manufacturing a nonvolatile semiconductor memory element according to the first embodiment.
Figure 3A:
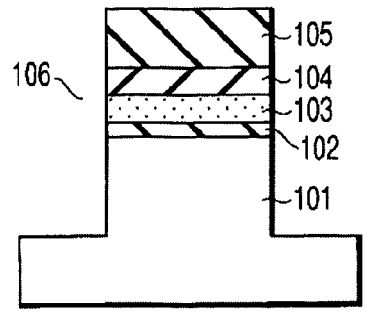
FIGS. 3A to 3F are sectional views taken along the direction of channel width and showing steps in manufacturing the nonvolatile semiconductor memory element according to the first embodiment.

First, as shown in FIGS. 2A and 3A, a 10-nm thick tunnel insulating film 102 is formed by thermal oxidation on the surface of a silicon substrate 101 doped with a desired impurity. Subsequently, a 30-nm thick polysilicon layer 103 serving as the lower layer portion of a floating gate electrode, a 50-nm thick silicon nitride film 104 serving as a stopper for CMP, and a 200-nm thick silicon oxide film 105 serving as a mask for RIE are sequentially deposited by low pressure CVD.

The silicon oxide film 105, silicon nitride film 104, polysilicon layer 103, and tunnel insulating film 102 are sequentially etched by RIE using a resist mask (not shown) having a pattern corresponding to an element isolation trench. The exposed region of the silicon substrate 101 is also etched to form a 200-nm deep element isolation trench 106.

Figure 2B:
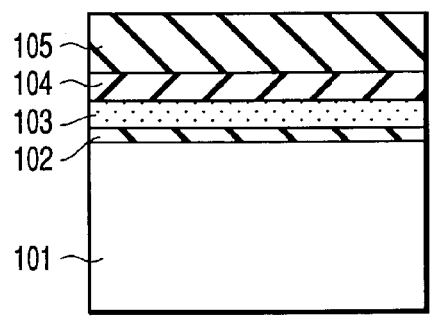
Figure 3D:
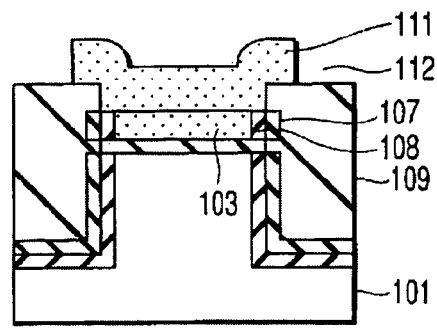
Figure 3B:
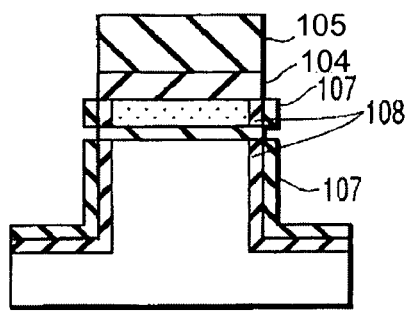

As shown in FIGS. 2B and 3B, a 5-nm thick silicon oxide film 107 is formed on the exposed surface of the silicon substrate 101 and that of the polysilicon layer 103 by thermal oxidation. Thermal nitriding is performed in a nitrogen monoxide atmosphere at 900° C. to form silicon nitride films 108 on the interface between the silicon substrate and the silicon oxide film and the interface between the polysilicon layer and the silicon oxide film. The nitrogen content of the silicon nitride film 108 is about $1 \times 10^{15}$ cm$^{-2}$.

Figure 4:
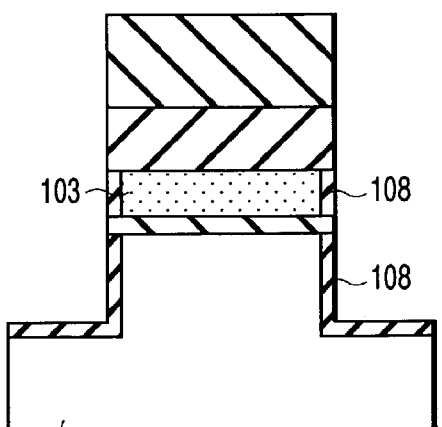
FIG. 4 is a sectional view showing a modification to the first embodiment.

The silicon nitride film 108 need not always be formed through the oxide film. More specifically, as shown in FIG. 4, formation of the silicon oxide film 107 may be omitted, and the silicon surface exposed into the element isolation trench 106 may be directly thermally nitrided.

Figure 2C:
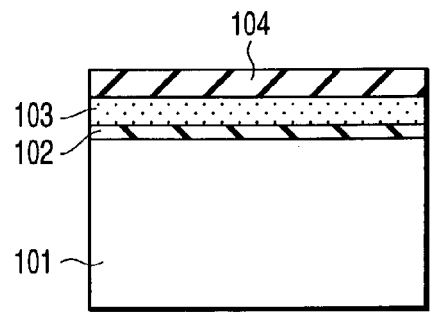
Figure 3E:
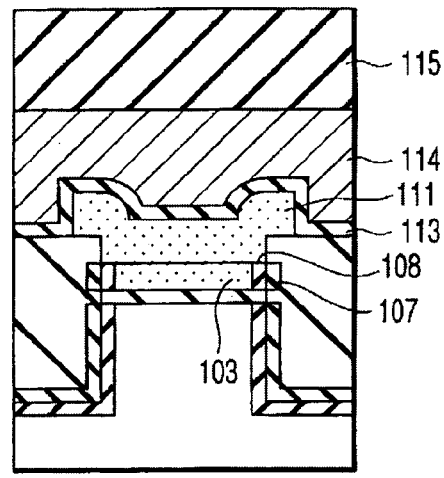
Figure 3C:
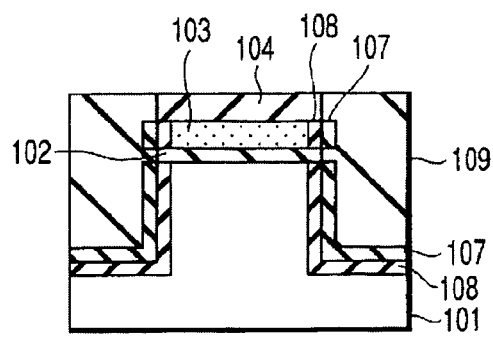

As shown in FIGS. 2C and 3C, a 400-nm thick silicon oxide film 109 for element isolation is deposited on the entire surface of the element by plasma CVD to fully fill the element isolation trench 106. After that, the silicon oxide film 109 of the surface portion and the silicon oxide film 105 for the mask are removed by CMP to planarize the surface.

Figure 2D:
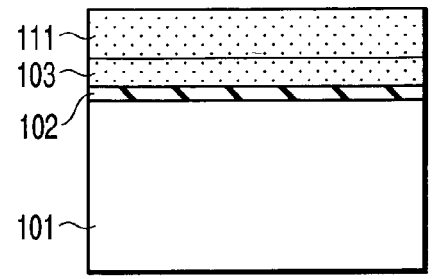

As shown in FIGS. 2D and 3D, after the exposed silicon nitride film 104 is etched using phosphoric acid solution, a 50-nm thick polysilicon layer 111 serving as the upper layer portion of the floating gate electrode is deposited by low pressure CVD. After that, the polysilicon layer 111 is etched by RIE using a resist mask (not shown) to form slit portions 112 which separate adjacent floating gate electrodes.

Figure 2E:
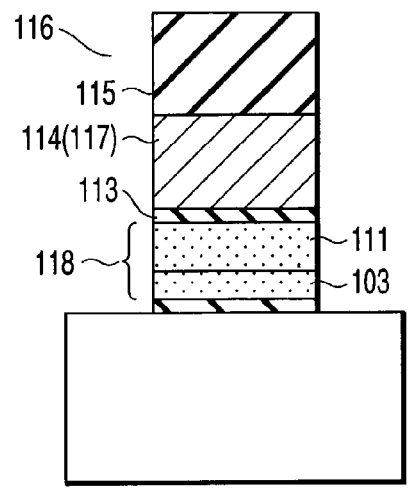

As shown in FIGS. 2E and 3E, a silicon oxide film, silicon nitride film, and silicon oxide film are sequentially deposited on the entire surface by low pressure CVD to form a 15-nm thick electrode insulating film 113 having a three-layered structure. After that, a polysilicon layer and tungsten silicide layer are sequentially deposited by low pressure CVD to form a 100-nm thick conductive layer 114 having a two-layered structure serving as a control gate electrode. Then, a 100-nm thick silicon nitride film 115 is deposited by low pressure CVD.

After that, the silicon nitride film 115, conductive layer 114, electrode insulating film 113, polysilicon layer 111, polysilicon layer 103, and tunnel insulating film 102 are sequentially etched by RIE using a resist mask (not shown) corresponding to the control gate pattern to form slit portions 116 in the direction of word line. Accordingly, the shapes of a control gate electrode 117 and floating gate electrode 118 are defined.

Figure 2F:
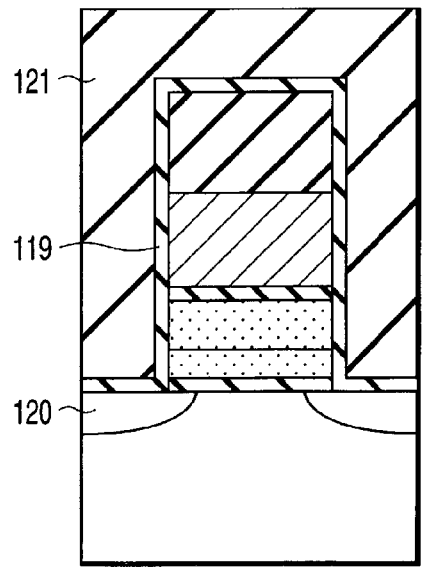
Figure 3F:
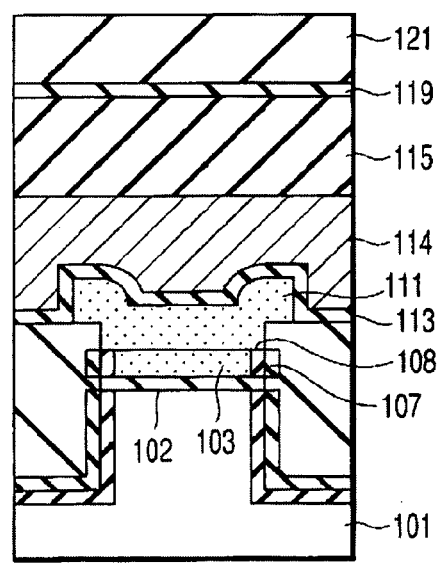

As shown in FIGS. 2F and 3F, a 10-nm thick silicon oxide film is formed on the exposed surface by low pressure CVD. After that, oxygen radical oxidation is performed at 800° C. and 1 kPa for 30 min using a remote plasma method to form a silicon oxide film 119 called an electrode sidewall oxide film. The electrode sidewall oxide film 119 has a thickness of 12 nm on the sidewall of the floating gate electrode 118. Then, ion implantation is performed to form source/drain diffusion layers 120. A BPSG film 121 that serves as an interlayer dielectric film and covers the entire surface is formed by low pressure CVD. An interconnection layer and the like are formed by a known method, thereby completing a nonvolatile semiconductor memory element.

According to this embodiment, the nitride films 108 are formed in advance on the sidewall surfaces on the element isolation insulating film sides of the polysilicon layer 103 serving as a floating gate electrode. Accordingly, the silicon crystal grain can be prevented from spreading to the element isolation region sides in annealing after the floating gate electrode process. At the boundary to the element isolation region, the floating gate electrode 118 maintains the shape immediately after the gate process. For this reason, any variation in shape (area) of the floating gate electrode 118 between different elements can be suppressed. Any variation in memory characteristic between elements due to growth of silicon crystal grain in steps in manufacturing a semiconductor memory device can be prevented. Hence, the manufacturing yield can be increased.

In this embodiment, the silicon nitride film 108 is formed by thermal nitriding using nitrogen monoxide gas. However, any other nitriding gas may be used. Alternatively, the silicon nitride film 108 may be formed by any other means such as plasma nitriding.

Figure 5A:
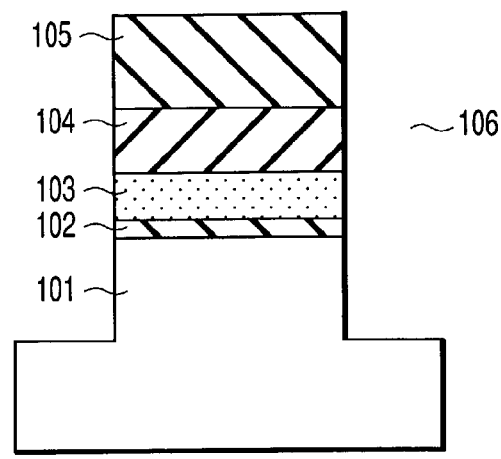
FIGS. 5A to 5C are sectional views showing another modification of the first embodiment.
Figure 5B:
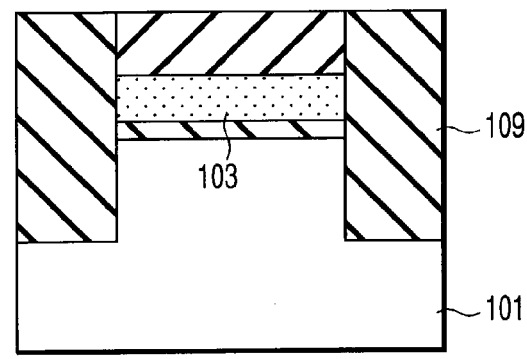
Figure 5C:
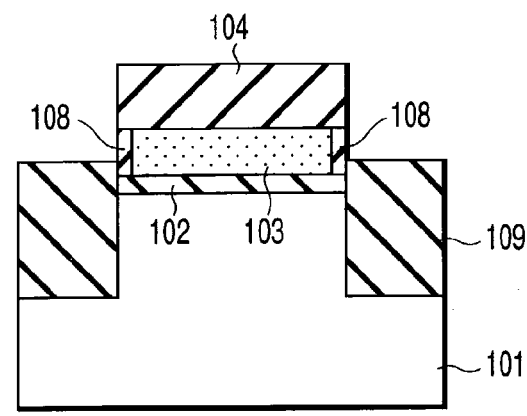

In this embodiment, the silicon nitride film 108 is formed not only on each sidewall surface of the floating gate electrode 12 but also on the surface of the silicon substrate 101 exposed into the element isolation trench 106. This is not preferable because it causes a disadvantage such as an increase in junction leakage. To avoid such a disadvantage, the silicon nitride film 108 is formed only on each side surface of the silicon layer 103, as shown in FIGS. 5A to 5C.

This method will be described in more detail. First, as shown in FIG. 5A, a structure with the element isolation trench 106 is formed using the same method as described above. Next, as shown in FIG. 5B, after the element isolation trench 106 is filled with the silicon oxide film 109 for element isolation, the surface is planarized by CMP. As shown in FIG. 5C, the silicon oxide film 109 for element isolation is partially etched using diluted hydrofluoric acid solution to expose the sidewall surfaces of the floating gate electrode. Then, the silicon nitride films 108 are formed on the side surfaces of the polysilicon layer 103 by a means such as thermal nitriding.

Second Embodiment

FIGS. 6A to 6D are sectional views showing steps in manufacturing a nonvolatile semiconductor memory element according to the second embodiment. FIGS. 6A to 6D show a section in the direction of channel width, like FIGS. 3A to 3F. In this embodiment, the state shown in FIG. 1A is realized by a simpler manufacturing step than in the first embodiment.

Figure 6A:
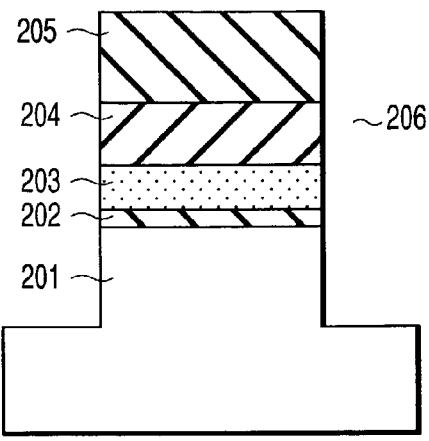
FIGS. 6A to 6D are sectional views showing steps in manufacturing a nonvolatile semiconductor memory element according to the second embodiment.

First, as shown in FIG. 6A, a 10-nm thick tunnel insulating film 202 is formed by thermal oxidation on the surface of a silicon substrate 201 doped with a desired impurity. Then, a 30-nm thick polysilicon layer 203 serving as the lower layer portion of a floating gate electrode, a 50-nm thick silicon nitride film 204 serving as a stopper for CMP, and a 200-nm thick silicon oxide film 205 serving as a mask for RIE are sequentially deposited by low pressure CVD. The silicon oxide film 205, silicon nitride film 204, polysilicon layer 203, and tunnel insulating film 202 are sequentially etched by RIE using a resist mask (not shown) having a pattern corresponding to an element isolation trench. The exposed region of the silicon substrate 201 is also partially etched to form a 200-nm deep element isolation trench 206.

Figure 6C:
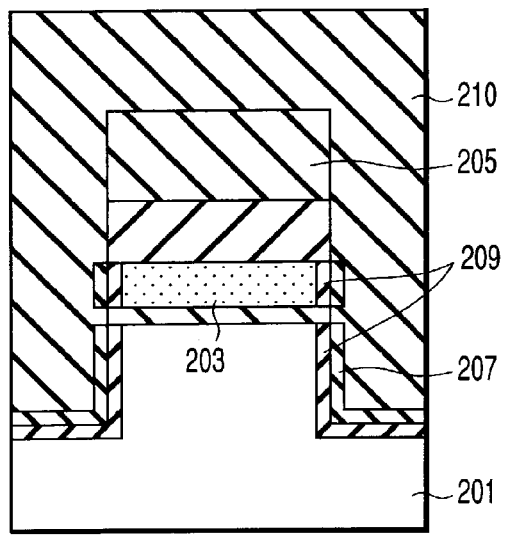
Figure 6B:
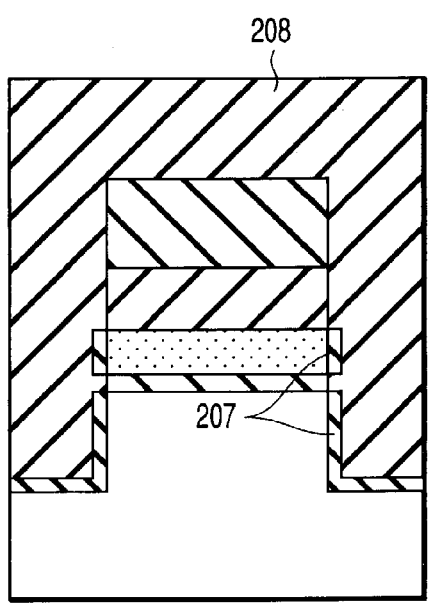
Figure 6D:
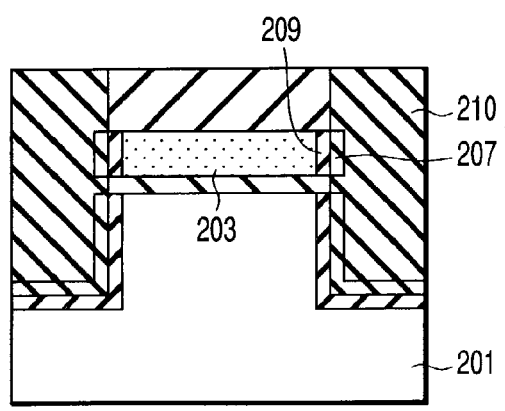

As shown in FIG. 6B, a 5-nm thick silicon oxide film 207 is formed on the silicon surface exposed into the element isolation trench 206 by thermal oxidation. After that, a perhydrogenated silazane polymer $((SiH_2NH)_n)$ 208 serving as an insulating film for element isolation is applied to the entire surface to completely fill the element isolation trench 206.

As shown in FIG. 6C, annealing is performed in a water vapor atmosphere at 800° C. to convert the perhydrogenated silazane polymer 208 into a silicon oxide film 210. Ammonia is generated in this conversion reaction. Hence, silicon nitride films 209 are formed on the interface between the silicon substrate 201 and the silicon oxide film 207 and the interface between the polysilicon layer 203 and the silicon oxide film 207. The nitrogen content of the silicon nitride film 209 is about $3 \times 10^{14}$ cm$^{-2}$.

After that, the silicon oxide film 210 of the surface portion and the silicon oxide film 205 for the mask are removed by CMP to planarize the structure surface. Then, a memory element is completed by the same method as in the prior art.

According to this embodiment, the same effect as in the first embodiment described above can be obtained. In addition, when the silazane polymer 208 is used as an element isolation insulating film, any increase in number of manufacturing steps for forming the silicon nitride film 209 can be prevented.

In this embodiment, the perhydrogenated silazane polymer 208 is applied to fill the element isolation trench 206. Instead, any other silazane polymer may be used. A coating film containing nitrogen can provide the same effect as described above. In this embodiment, the perhydrogenated silazane polymer 208 is applied after formation of the silicon oxide film 207. However, the perhydrogenated silazane polymer 208 may directly be applied into the element isolation trench 206 without forming the silicon oxide film 207.

In this embodiment, the silicon nitride film 209 is formed not only on each sidewall surface of the floating gate electrode but also on the surface of the silicon substrate 201 exposed into the element isolation trench 206. This is not preferable because it causes a disadvantage such as an increase in junction leakage, as described above. The nitrogen concentration on the sidewall surface of the floating gate electrode is preferably higher than that on the silicon substrate surface.

To realize this, hydrofluoric acid or the like, which increases the speed of nitriding reaction, is doped into the polysilicon layer 203 serving as a floating gate electrode in advance. Any other technique for changing the nitriding speed between the silicon substrate 201 and the polysilicon layer 203 is employed. It is known that the concentration of supplied nitrogen decreases in ammonic nitriding through a thick oxide film. Hence, the oxidation speed may be changed between the silicon substrate 201 and the polysilicon layer 203 by doping an impurity such as boron or phosphorus that increases the speed of oxidation reaction into the silicon substrate 201.

Third Embodiment

FIGS. 7A to 7F and 8A to 8F are sectional views showing steps in manufacturing a nonvolatile semiconductor memory element according to the third embodiment. FIGS. 7A to 7F show a section taken along the direction of channel length, and FIGS. 8A to 8F show a section taken along the direction of channel width.

In this embodiment, the dielectric breakdown voltage of a nonvolatile memory element manufactured by the method of the first or second embodiment is raised to further increase the yield of memory devices.

Figure 7A:
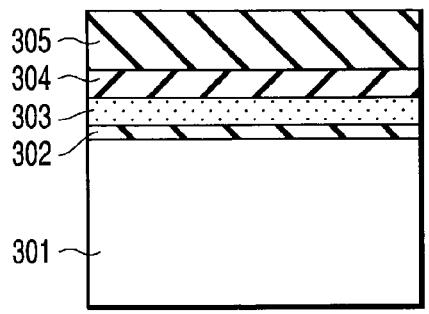
FIGS. 7A to 7F are sectional views taken along the direction of channel length and showing steps in manufacturing a nonvolatile semiconductor memory element according to the third embodiment.
Figure 8A:
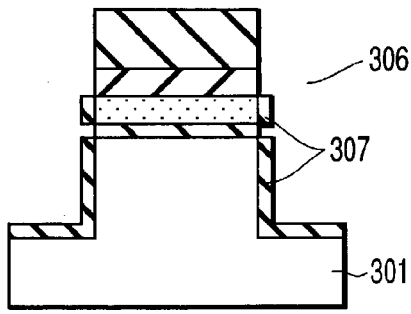
FIGS. 8A to 8F are sectional views taken along the direction of channel width and showing steps in manufacturing the nonvolatile semiconductor memory element according to the third embodiment.

First, as shown in FIGS. 7A and 8A, a 10-nm thick tunnel insulating film 302 is formed by thermal oxynitriding on the surface of a silicon substrate 301 doped with a desired impurity. Subsequently, a 30-nm thick polysilicon layer 303 serving as the lower layer portion of a floating gate electrode, a 50-nm thick silicon nitride film 304 serving as a stopper for CMP, and a 200-nm thick silicon oxide film 305 serving as a mask for RIE are sequentially deposited by low pressure CVD.

The silicon oxide film 305, silicon nitride film 304, polysilicon layer 303, and tunnel insulating film 302 are sequentially etched by RIE using a resist mask (not shown) having a pattern corresponding to an element isolation trench. The exposed region of the silicon substrate 301 is also etched to form a 200-nm deep element isolation trench 306. Next, a 5-nm thick silicon oxide film 307 is formed on the exposed silicon surface by thermal oxidation.

Figure 7B:
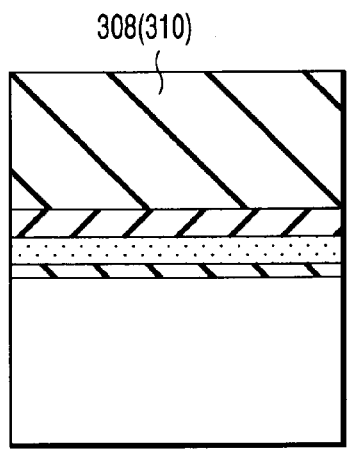
Figure 8D:
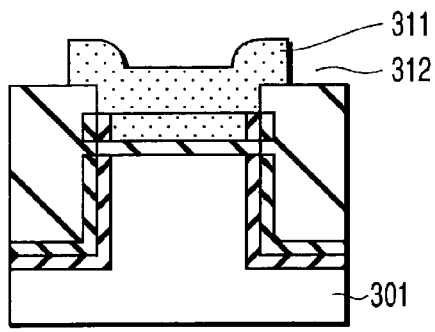
Figure 8B:
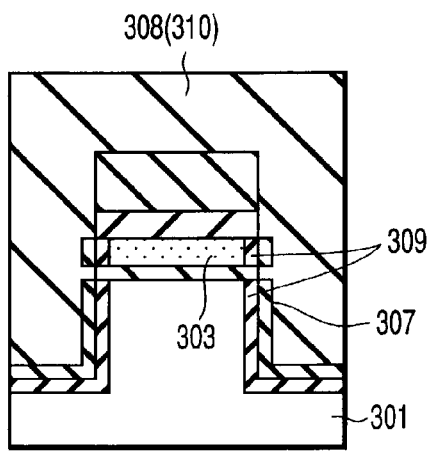

As shown in FIGS. 7B and 8B, a perhydrogenated silazane polymer 308 serving as an insulating film for element isolation is applied to the entire surface to completely fill the element isolation trench 306. After that, annealing is performed in an atmosphere containing water vapor at 800° C. to convert the perhydrogenated silazane polymer 308 into a silicon oxide film 310. Ammonia is generated in this conversion reaction. Hence, silicon nitride films 309 are formed on the interface between the silicon substrate 301 and the silicon oxide film 307 and the interface between the polysilicon layer 303 and the silicon oxide film 307. The nitrogen content of the silicon nitride film is about $3 \times 10^{14}$ cm$^{-2}$.

Figure 7C:
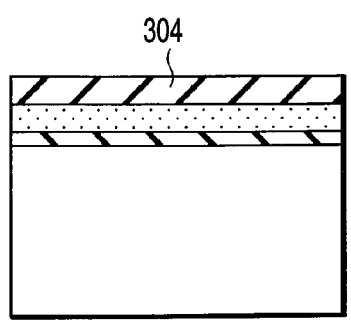
Figure 8E:
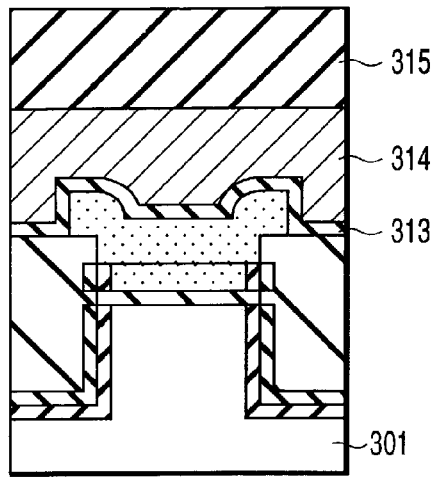
Figure 8C:
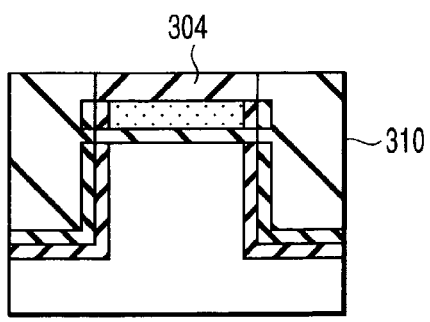

As shown in FIGS. 7C and 8C, the silicon oxide film 310 of the surface portion and the silicon oxide film 305 for the mask are removed by CMP to planarize the structure surface. At this time, the silicon nitride film 304 serving as a stopper for CMP is exposed.

Figure 7D:
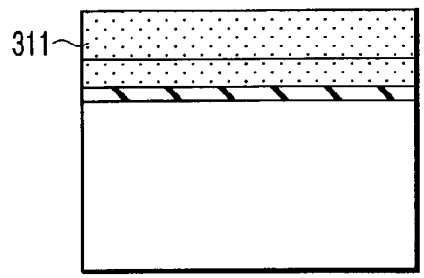

As shown in FIGS. 7D and 8D, after the exposed silicon nitride film 304 is etched using phosphoric acid solution, a 50-nm thick polysilicon layer 311 serving as the upper layer portion of the floating gate electrode is deposited by low pressure CVD. After that, the polysilicon layer 311 is etched by RIE using a resist mask (not shown) to form slit portions 312 which separate adjacent floating gate electrodes.

Figure 7E:
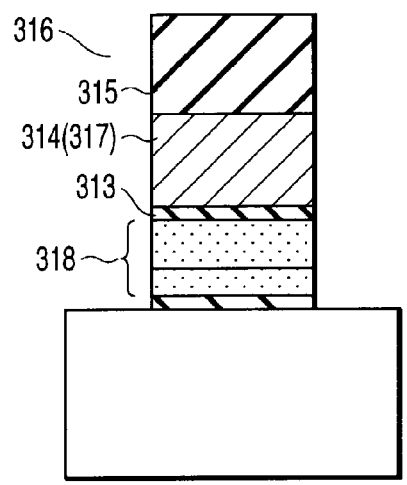

As shown in FIGS. 7E and 8E, a silicon oxide film, silicon nitride film, and silicon oxide film are sequentially deposited on the entire surface by low pressure CVD to form a 15-nm thick electrode insulating film 313 having a three-layered structure. After that, a polysilicon layer and tungsten silicide layer are sequentially deposited by low pressure CVD to form a 100-nm thick conductive layer 314 having a two-layered structure serving as a control gate electrode. Then, a 100-nm thick silicon nitride film 315 is deposited by low pressure CVD.

After that, the silicon nitride film 315, conductive layer 314, electrode insulating film 313, polysilicon layer 311, polysilicon layer 303, and tunnel insulating film 302 are sequentially etched by RIE using a resist mask (not shown) corresponding to the control gate pattern to form slit portions 316 in the direction of word line. Accordingly, the shapes of a control gate electrode 317 and floating gate electrode 318 are defined.

Figure 7F:
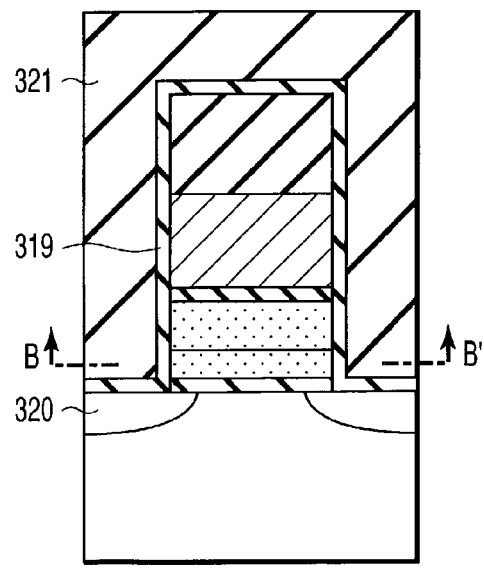
Figure 8F:
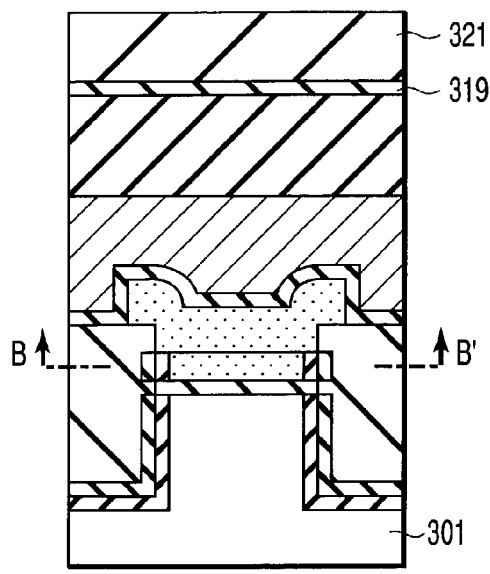

As shown in FIGS. 7F and 8F, a 10-nm thick silicon oxide film is formed on the exposed surface by low pressure CVD. After that, oxygen radical oxidation is performed at 800° C. and 1 kPa for 30 min using a remote plasma method to form a silicon oxide film 319 called an electrode sidewall oxide film. The electrode sidewall oxide film 319 has a thickness of 12 nm on the sidewall of the floating gate electrode. Then, ion implantation is performed to form source/drain diffusion layers 320. A BPSG film 321 that serves as an interlayer dielectric film and covers the entire surface is formed by low pressure CVD. An interconnection layer and the like are formed by a known method, thereby completing a nonvolatile semiconductor memory element.

Figure 9A:
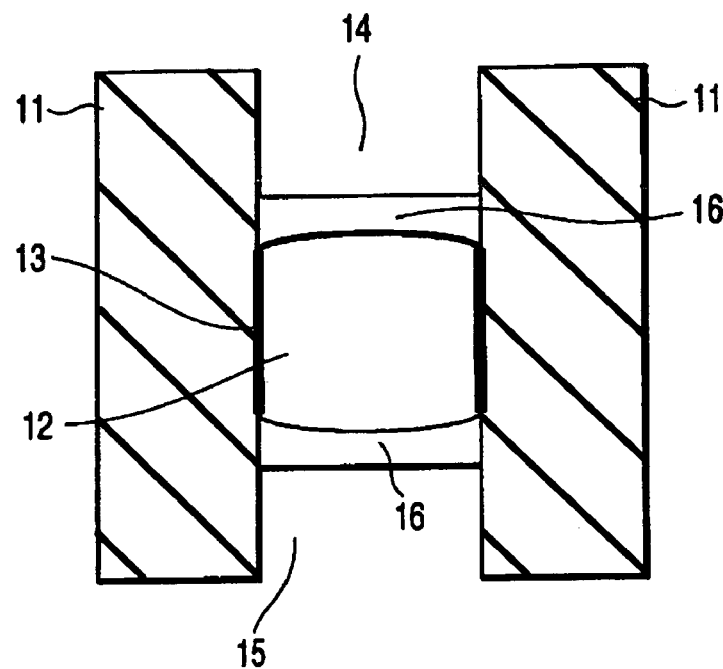
FIGS. 9A and 9B are schematic views showing comparison between radical oxidation and normal oxidation so as to explain a sectional structure obtained by cutting a nonvolatile semiconductor memory element along a plane including a floating gate electrode.

FIG. 9A shows a sectional structure (section taken along B–B' in FIGS. 7F and 8F) taken along a plane including the lower layer portion of the floating gate electrode of the memory element formed by the above-described method. Referring to FIG. 9A, reference numeral 11 denotes an element isolation region (308); 12, a floating gate electrode (303); 13, a sidewall nitride layer (309); 14, a source region (320); 15, a drain region (320); and 16, an electrode sidewall oxide film (319).

The nitride layers 13 are formed on the sidewalls on the element isolation sides of the floating gate electrode 12. The electrode sidewall oxide films 16 are formed on the sidewalls on the source/drain region sides. In this embodiment, the electrode sidewall oxide films 16 are not thin at the corner portions of the floating gate electrode 12. Hence, the dielectric breakdown voltage between the floating gate electrode 12 and the source and drain regions 14 and 15 rises so that the yield of memory devices increases. This effect is obtained by forming the electrode sidewall oxide film 16 by oxygen radical oxidation. That is, since the speed of oxidation of silicon almost equals that of the silicon nitride film in oxygen radical oxidation, the nitrided corner portions do not become thin.

Figure 9B:
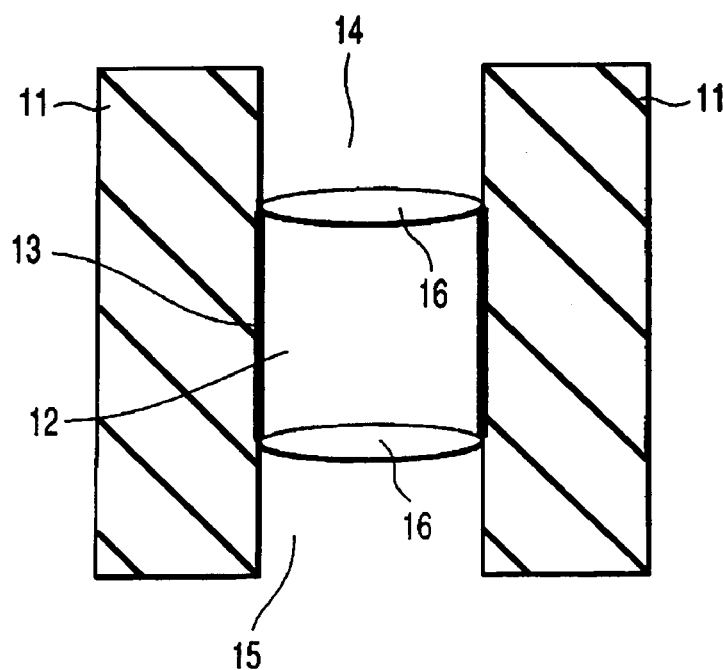

FIG. 9B shows a sectional structure when the electrode sidewall oxide film 16 is formed by conventional thermal oxidation using oxygen gas or water vapor as an oxidant. Since the oxidation speed is low at the nitrided corner portions of the floating gate electrode, the corner portions become thin. For this reason, the dielectric breakdown voltage between the floating gate electrode 12 and the source and drain regions 14 and 15 drops so that the yield of memory devices decreases.

According to this embodiment, the nitride film 309 is formed in advance on each of the sidewall surfaces on the element isolation insulating film sides of the polysilicon layer 303 serving as a floating gate electrode. Hence, the variation in shape (area) of the floating gate electrode between different elements can be suppressed, and the variation in memory characteristic between the elements can be prevented, as in the first embodiment. In addition, the following effect is also obtained. Since oxidation using oxygen radical is performed to form the electrode sidewall oxide film, the floating gate electrode can be made sufficiently thick on the element isolation insulating film sides. For this reason, the dielectric breakdown voltage between the floating gate electrode and the source/drain diffusion layers can be prevented from decreasing. Hence, the dielectric breakdown voltage of the nonvolatile semiconductor memory element can be raised, and the yield of memory devices can be further increased.

In this embodiment, the electrode sidewall oxide film is formed by oxygen radical oxidation of a remote plasma method. Oxidation may be performed in any atmosphere containing oxygen radicals as an oxidation species. For example, ozone oxidation may be used. Alternatively, oxygen radicals may be generated by supplying oxygen gas and hydrogen gas and heating. In this embodiment, oxygen radical oxidation is performed through a silicon oxide film formed by low pressure CVD. However, oxygen radical oxidation may be directly performed, and any other combinations may be used.

Fourth Embodiment

FIGS. 10A to 10E are sectional views showing steps in manufacturing a transistor element according to the fourth embodiment. In this embodiment, the dielectric breakdown voltage of a transistor element having an element isolation region formed using filling of silazane polymer is raised to increase the yield of semiconductor devices.

Figure 10A:
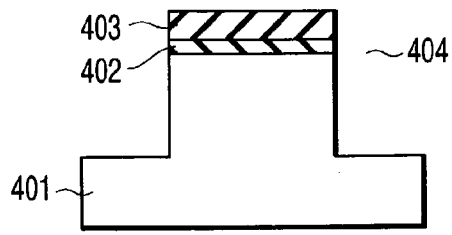
FIGS. 10A to 10E are sectional views showing steps in manufacturing a transistor element according to the fourth embodiment.

First, as shown in FIG. 10A, a 10-nm thick silicon oxide film 402 called a pad oxide film is formed on the surface of a silicon substrate 401 by thermal oxidation. Subsequently, a 50-nm thick silicon nitride film 403 serving as a stopper for CMP is deposited by low pressure CVD. The silicon nitride film 403 and silicon oxide film 402 are sequentially etched by RIE using a resist mask (not shown). In addition, the exposed region of the silicon substrate 401 is etched to form a 200-nm deep element isolation trench 404.

Figure 10D:
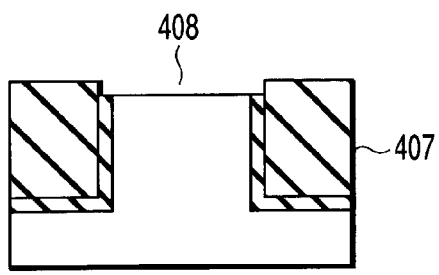
Figure 10B:
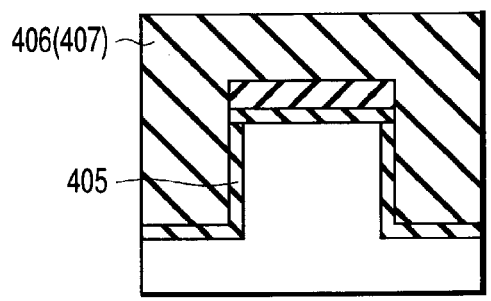

As shown in FIG. 10B, a 5-nm thick silicon oxide film 405 is formed on the exposed silicon surface by thermal oxidation. A perhydrogenated silazane polymer 406 serving as an insulating film for element isolation is applied to the entire surface to completely fill the element isolation trench 404. After that, annealing is performed in a water vapor atmosphere at 800° C. to convert the perhydrogenated silazane polymer 406 into a silicon oxide film 407.

Figure 10E:
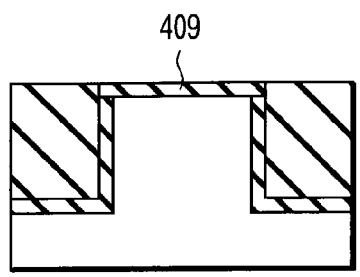
Figure 10C:
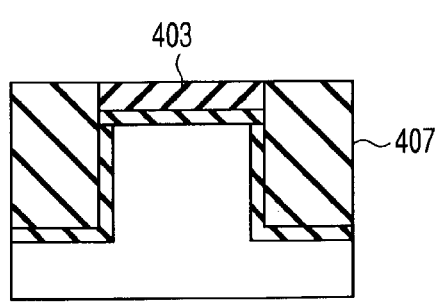

As shown in FIG. 10C, the silicon oxide film 407 of the surface portion is removed by CMP to planarize the structure surface. At this time, the silicon nitride film 403 serving as a stopper for CMP is exposed.

As shown in FIG. 10D, the exposed silicon nitride film 403 is etched using phosphoric acid solution. Then, the pad oxide film 402 is etched using diluted hydrofluoric acid solution to expose a silicon substrate surface 408. At this time, the surface of the element isolation oxide film 407 is also etched and retreats by 20 nm.

As shown in FIG. 10E, the exposed silicon substrate surface is oxidized in an oxygen atmosphere containing 10% ozone at 800° C. and 100 Pa for 30 min to form a gate oxide film 409.

A gate electrode, source/drain diffusion layers, interconnection layer, and the like are formed by the same method as in the prior art, thereby completing a transistor element.

The gate oxide film 409 of the transistor formed in this embodiment has a higher dielectric breakdown voltage than that formed by conventional thermal oxidation using oxygen gas or water vapor as an oxidant. Hence, the yield of semiconductor devices largely increases.

Figure 12A:
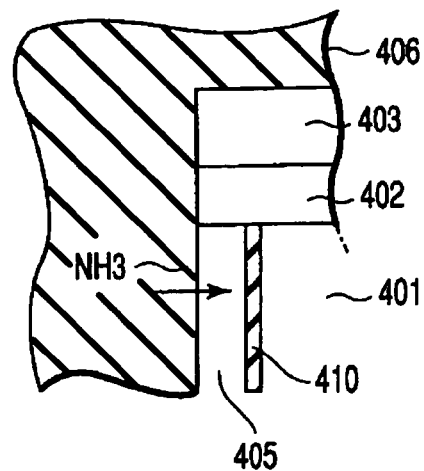
FIGS. 12A to 12C are views for explaining a problem posed when gate oxidation is executed by normal thermal oxidation in the fourth embodiment.
Figure 12B:
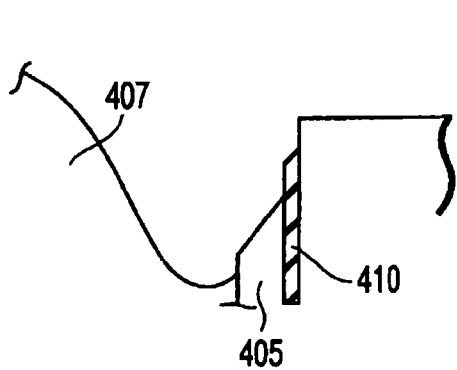
Figure 12C:
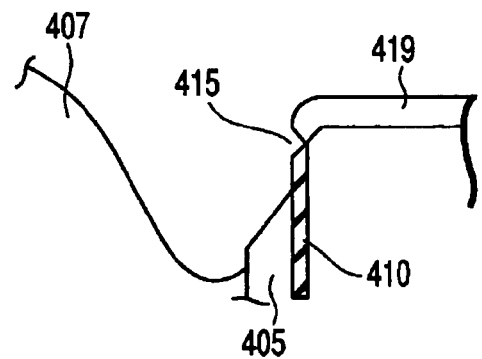

The reason why the dielectric breakdown voltage is low in the conventional oxidation method was inspected. A gate oxide film 419 became thinner at an element isolation end portion 415, as shown in FIG. 12C. This decrease in thickness occurs due to the following mechanism. When the perhydrogenated silazane polymer 406 with which the element isolation trench is filled is converted into the silicon oxide film 407, ammonia gas ($NH_3$) is generated to form a nitride layer 410 on the silicon substrate surface. For this reason, in etching using diluted hydrofluoric acid solution immediately before formation of the gate oxide film, the pad oxide film 402 on the silicon substrate and the thermal oxide film 405 on the side portions of the silicon substrate are removed, as shown in FIG. 12B, so the nitride layer 410 is partially exposed. Hence, in the conventional gate oxidation method, the exposed portion of the nitride layer 410 becomes thin to form the thin region 415, as shown in FIG. 12C.

Figure 11:
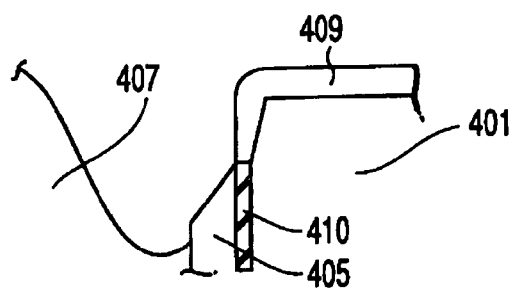
FIG. 11 is an enlarged sectional view showing the corner portion of the element formation region of the transistor element according to the fourth embodiment.

On the other hand, for the gate oxide film 409 formed in this embodiment, the decrease in thickness at the element isolation end portion is suppressed, as shown in FIG. 11. This is because the exposed portion of the nitride layer 410 is sufficiently oxidized because oxidation using oxygen radicals is performed.

According to this embodiment, even when the gate oxide film 409 is used as an insulating film that fills the element isolation trench, any local decrease in thickness of the gate oxide film 409 can prevented. Hence, the yield of devices can be increased. In addition, since the dielectric breakdown voltage is increased by preventing the local decrease in thickness of the gate oxide film 409, a sufficient element isolation capability can be realized.

In this embodiment, the perhydrogenated silazane polymer 406 is use to fill the element isolation trench 404. Any other silazane polymer may be used. The same effect as described above can be obtained even using any other coating film containing nitrogen. In this embodiment, the gate oxide film 409 is formed by ozone oxidation. Instead, oxidation may be executed in any other atmosphere containing oxygen radicals as an oxidation species. Oxygen radical oxidation of a remote plasma method or other method may be used. Oxygen radicals may be generated by supplying oxygen gas and hydrogen gas and heating.

In this embodiment, the silicon oxide film 409 formed by oxygen radical oxidation is directly used as a gate oxide film. However, the silicon oxide film may be converted into an oxynitride film by doping nitrogen by thermal nitriding using nitrogen monoxide gas or radical nitriding using nitrogen radicals. An element except nitrogen may be doped into the gate oxide film 409. Another insulating film such as a high-k dielectric film may be formed on these films to make a multilayered structure.

The present invention is not limited to the above-described embodiments, and various changes and modifications can be made within the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having a nonvolatile semiconductor memory element with a two-layered gate structure, comprising the steps of:
    forming a tunnel insulating film and one of a polysilicon layer and an amorphous silicon layer serving as a floating gate electrode on one major surface of a semiconductor substrate;
    selectively etching the one of the polysilicon layer and the amorphous silicon layer, the tunnel insulating film, and the semiconductor substrate using a mask having a pattern corresponding to an element isolation trench so as to form the element isolation trench;
    forming a nitride film on a first sidewall surface, perpendicular to a channel width direction of the floating gate electrode, of the one of the polysilicon layer and the amorphous silicon layer exposed into the element isolation trench and burying an element isolation insulating film in the element isolation trench;
    stacking an electrode insulating film and a conductive film serving as a control gate electrode on the element isolation insulating film and the one of the polysilicon layer and the amorphous silicon layer;
    selectively etching the conductive film, the electrode insulating film, and the one of the polysilicon layer and the amorphous silicon layer using a mask having a pattern corresponding to the control gate electrode so as to form the control gate electrode and floating gate electrode; and
    forming a silicon oxide film on a second sidewall surface perpendicular to a channel length direction of the floating gate electrode, in an atmosphere containing radical oxygen, so that a thickness in the channel length direction of the silicon oxide film is greater at a portion on an element isolation insulating film end of the second sidewall surface than at a center portion of the second sidewall surface.

2. A method according to claim 1, wherein
    to form the nitride film on the first sidewall surface of the one of the polysilicon layer and the amorphous silicon layer and bury the element isolation insulating film in the element isolation trench,
    after the first sidewall surface of the one of the polysilicon layer and the amorphous silicon layer is nitrided, the element isolation insulating film is buried in the element isolation trench.

3. A method according to claim 2, wherein before nitriding the first sidewall surface of the one of the polysilicon layer and the amorphous silicon layer, an oxide film is formed on the first sidewall surface of the one of the polysilicon layer and the amorphous silicon layer.

4. A method according to claim 1, wherein to form the nitride film on the first sidewall surface of the one of the polysilicon layer and the amorphous silicon layer and bury the element isolation insulating film in the element isolation trench,
    after a coating film containing nitrogen is buried in the element isolation trench, the coating film is annealed to convert the coating film into a silicon oxide film and nitride the first sidewall surface of the one of the polysilicon layer and the amorphous silicon layer.

5. A method according to claim 4, wherein before nitriding the first sidewall surface of the one of the polysilicon layer and the amorphous silicon layer, an oxide film is formed on the first sidewall surface of the one of the polysilicon layer and the amorphous silicon layer.

6. A method according to claim 4, wherein a silazane polymer is used as the coating film.

7. A method according to claim 1, wherein a nitrogen concentration on the first sidewall surface of the one of the polysilicon layer and the amorphous silicon layer is higher than that in a sidewall of the semiconductor substrate.

8. A method according to claim 1, wherein the forming one of the polysilicon layer and the amorphous silicon layer to have a two-layered structure as the floating gate electrode, includes forming a first layer on the tunnel insulating film, and forming a second layer on the first silicon layer and element isolation insulating film after the element isolation insulating film is buried.

9. A method of manufacturing a semiconductor device having a transistor element, comprising:
    forming an element isolation trench on one major surface side of a semiconductor substrate to surround an element formation region;
    burying a coating film containing nitrogen in the element isolation trench;
    converting the coating film into a first silicon oxide film to form an element isolation insulating film and a first silicon nitride film by nitriding the semiconductor substrate on a sidewall surface of the element isolation trench and to form a second silicon nitride film on a portion of a sidewall surface of the element formation region; and
    forming a second silicon oxide film on a surface of the semiconductor substrate in the element formation region in an atmosphere containing radical oxygen after forming the first and second nitride films.

10. A method according to claim 9, wherein the second silicon oxide film is used as one of a gate insulating film and part of the gate insulating film.

11. A method according to claim 9, wherein the coating film is made of silazane polymer.

12. A method according to claim 9, wherein the coating film is buried in the element isolation trench after a thermal oxide film is formed on the sidewall surface of the element isolation trench.

13. A method of manufacturing a semiconductor device having a nonvolatile semiconductor memory element with a two-layered gate structure, comprising:
    stacking a tunnel insulating film and one of a polysilicon layer and an amorphous silicon layer serving as a floating gate electrode on one major surface of a semiconductor substrate;
    selectively etching the one of the polysilicon layer and the amorphous silicon layer, the tunnel insulating film, and the semiconductor substrate using a mask having a pattern corresponding to an element isolation trench so as to form the element isolation trench;
    forming a nitride film on a sidewall surface of the one of the polysilicon layer and the amorphous silicon layer exposed into the element isolation trench and burying an element isolation insulating film in the element isolation trench;
    stacking an electrode insulating film and a conductive film serving as a control gate electrode on the element isolation insulating film and the one of the polysilicon layer and the amorphous silicon layer; and
    selectively etching the conductive film, the electrode insulating film, and the one of the polysilicon layer and the amorphous silicon layer using a mask having a pattern corresponding to the control gate electrode so as to form the control gate electrode and floating gate electrode;
    wherein forming the nitride film on the sidewall surface of the one of the polysilicon layer and the amorphous silicon layer and burying the element isolation insulating film in the element isolation trench includes,
    after a coating film containing nitrogen is buried in the element isolation trench, annealing the coating film to convert the coating film into a silicon oxide film and nitride the sidewall surface of the one of the polysilicon layer and the amorphous silicon layer.

14. A method of manufacturing a semiconductor device having a nonvolatile semiconductor memory element with a two-layered gate structure, comprising:
    stacking a tunnel insulating film and one of a polysilicon layer and an amorphous silicon layer serving as a floating gate electrode on one major surface of a semiconductor substrate;
    selectively etching the one of the polysilicon layer and the amorphous silicon layer, the tunnel insulating film, and the semiconductor substrate using a mask having a pattern corresponding to an element isolation trench so as to form the element isolation trench;
    forming a nitride film on a sidewall surface of the one of the polysilicon layer and the amorphous silicon layer exposed into the element isolation trench and burying an element isolation insulating film in the element isolation trench;
    stacking an electrode insulating film and a conductive film serving as a control gate electrode on the element isolation insulating film and the one of the polysilicon silicon layer and the amorphous silicon layer; and
    selectively etching the conductive film, the electrode insulating film, and the one of the polysilicon layer and the amorphous silicon layer using a mask having a pattern corresponding to the control gate electrode so as to form the control gate electrode and floating gate electrode;
    wherein a nitrogen concentration in the sidewall of the one of the polysilicon layer and the amorphous silicon layer is higher than that in a sidewall of the semiconductor substrate.

* * * * *